United States Patent
Sichmann et al.

(10) Patent No.: US 6,338,781 B1
(45) Date of Patent: Jan. 15, 2002

(54) MAGNETRON SPUTTERING CATHODE WITH MAGNET DISPOSED BETWEEN TWO YOKE PLATES

(75) Inventors: Eggo Sichmann, Gelnhausen; Michaell Muecke, Karben, both of (DE)

(73) Assignee: Singulus Technologies AG, Alzenau (DE)

( * ) Notice: Subject to any disclaimer, the term of this patent is extended or adjusted under 35 U.S.C. 154(b) by 0 days.

(21) Appl. No.: 09/331,409

(22) PCT Filed: Dec. 22, 1997

(86) PCT No.: PCT/EP97/07227

§ 371 Date: Aug. 30, 1999

§ 102(e) Date: Aug. 30, 1999

(87) PCT Pub. No.: WO98/28779

PCT Pub. Date: Jul. 2, 1998

(30) Foreign Application Priority Data

Dec. 21, 1996 (DE) .......................................... 196 54 000
Dec. 21, 1996 (DE) .......................................... 196 54 007
Dec. 21, 1996 (DE) .......................................... 196 53 999

(51) Int. Cl.$^7$ ............................................. C23C 14/34
(52) U.S. Cl. .............................. 204/298.12; 204/298.16
(58) Field of Search ..................... 204/298.16, 298.17, 204/298.19, 298.2, 298.12, 192.12

(56) References Cited

U.S. PATENT DOCUMENTS

| 4,865,708 A | * | 9/1989 | Welty ..................... 204/192.12 |
| 4,971,674 A | * | 11/1990 | Hata ........................ 204/298.2 |
| 5,330,632 A |   | 7/1994 | Sichmann .............. 204/298.18 |
| 5,688,388 A | * | 11/1997 | Bahr et al. ............. 204/298.19 |
| 5,744,011 A | * | 4/1998 | Okubo et al. .......... 204/298.19 |
| 5,863,399 A | * | 1/1999 | Sichmann .............. 204/298.19 |
| 5,876,576 A | * | 3/1999 | Fu ........................... 204/298.2 |

FOREIGN PATENT DOCUMENTS

| DE | 43 15 023 | 11/1994 |  |
| DE | 196 54 000 | 12/1996 |  |
| JP | 60-166 774 A | * 6/1985 | ............ 204/298.19 |
| JP | 61 231 168 A | * 10/1986 | ............ 204/298.19 |

* cited by examiner

Primary Examiner—Nam Nguyen
Assistant Examiner—Gregg Cantelmo
(74) Attorney, Agent, or Firm—Pillsbury Winthrop LLP

(57) ABSTRACT

The present invention relates to a device for cathode sputtering for producing coatings on a substrate by means of a sputtering cathode, which can be arranged in a vacuum chamber and comprises pole shoes, a target and at least one magnet or ring magnet 9 arranged concentrically with respect to the center axis of the sputtering cathode, wherein a divided yoke is arranged axially symmetrically with respect to the center axis of the sputtering cathode.

33 Claims, 7 Drawing Sheets

MAGNETRON SPUTTERING CATHODE WITH MAGNET DISPOSED BETWEEN TWO YOKE PLATES

Figure 1:
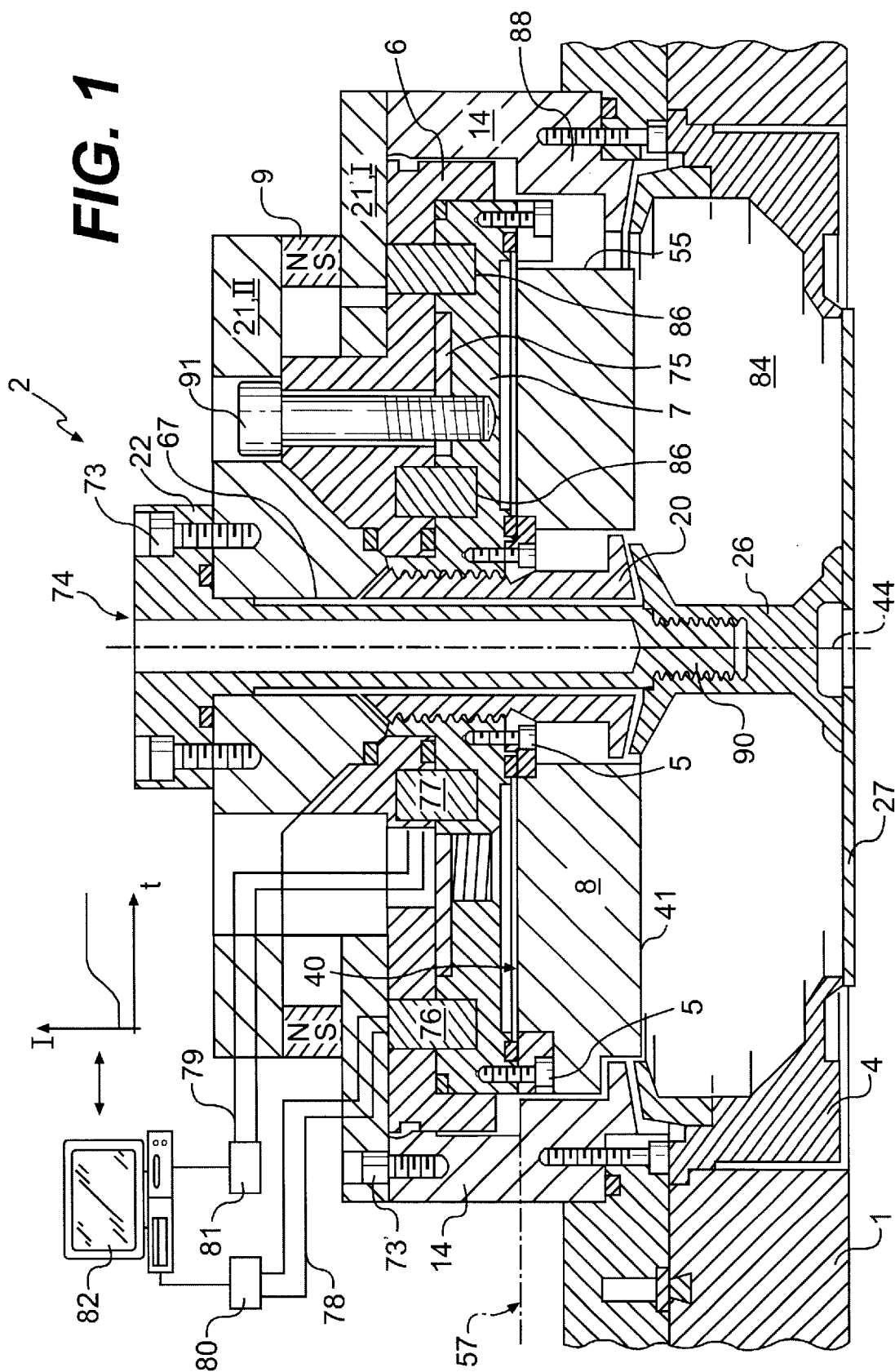

This application is the national phase of international application PCT/EP97/07227 filed Dec. 22, 1997 which designated the U.S.

The present invention relates to a device for cathode sputtering for producing coatings on a substrate by means of a sputtering cathode, which can be introduced into a vacuum chamber and comprises pole shoes, a target, at least one magnet, wherein in case of a circular sputtering cathode the latter is arranged concentrically with respect to the pole shoes, the target and the magnet. The shape of the sputtering cathode of the target, the pole shoes and the arrangement of the magnet can be adapted to the shape of the substrate.

A device for cathode sputtering for the static coating of disk-shaped substrates by means of a plasma in a vacuum chamber with at least one opening, which can be closed from the outside by placing a sputtering cathode on it, is already known DE 43 15 023 A1). An elastic vacuum seal ring and an annular anode are provided between the cathode and the chamber wall, which radially enclose the openings from the outside, wherein the anode has a flat contact surface on its surface facing the cathode. The known sputtering cathode consists of a disk-shaped ferromagnetic yoke and a cooling plate. A disk-shaped insulator is inserted between these two. The target to be sputtered is arranged in front of the cooling plate, while an annularly arranged magnet is inserted in a groove on the back of the cooling plate. A counter-magnetic field is generated by the annularly arranged magnet, which affects the path of the magnetic field lines. By means of this, the path of the magnetic field lines is given an approximately parallel or lens-shaped or convex form.

In contrast thereto, it is an object of the present invention to design a sputtering cathode in such a way that an optimum magnetic flow distribution is achieved.

In achieving this object, the invention starts out from the basic idea of dividing the yoke symmetrically. In case of a circular sputtering cathode, a divided yoke or a yoke formed of two parts is arranged axially symmetrically with respect to the center axis of the sputtering cathode. The divided or also stepped realization of the yoke plate allows a very simple and cost-efficient cathode design and also the use of a simple, for example an annularly arranged magnet, which can be realized, for example, as a square or rectangular magnet and not as a ring magnet, and can easily be provided between the yoke plates. Ring magnets are more complicated and thus more expensive than square or rectangular magnets.

By using magnetic coils, which can, for example, be arranged under the target or at any other place, the magnetic field in the target space can be influenced or varied purposefully, so that the plasma can be displaced radially from inside to outside. As a result, the erosion groove can be displaced radially over the target, and it is thus possible to either produce a very wide erosion groove by continuously varying the magnetic field or two erosion grooves next to each other by stepwise switching the magnetic field back and forth.

Moreover, it is advantageous that the divided yoke is provided in the area of the ring magnet and at least one part generating a varying magnetic field.

In an embodiment of the device according to the present invention it is furthermore possible that in the area of the first or second yoke plate or in the area of the outer circumference of the first or second yoke plate at least the annularly arranged magnet is provided, wherein between the target or between the back surface of the target and the yoke plate at least one first annularly arranged magnetic coil is provided.

In a further development of the invention it is advantageous that the first magnetic coil is provided in the area of the outer circumference of the target, and the second magnetic coil is provided in the area of the cooling head.

According to a preferred embodiment of the solution according to the invention, the two magnetic coils are eventually provided slightly above an upper limit or the back surface of the target.

It is of particular importance for the present invention that the two magnetic coils are arranged in the same transverse plane between the first or second yoke plates and/or the back surface of the target.

Moreover, it is advantageous that the annularly arranged magnet arranged in the area of the outer circumference of the first and/or second yoke is provided between the upper or second yoke plate and the lower or first yoke plate or between the yoke plates arranged in one plane.

Moreover, it is advantageous that the two magnetic coils and the ring magnet are arranged concentrically with the center axis of the sputtering cathode.

In this connection, it is advantageous that the ring magnet has an outer diameter which is about as large as, slightly smaller or slightly larger than the outer diameter of the first magnetic coil.

Moreover, it is advantageous that in an insulator provided between the target and at least one yoke plate and/or in the target ring chambers for receiving the magnetic coils are provided.

In a further embodiment of the device according to the invention it is also possible that the two magnetic coils have different diameters.

In a further embodiment of the invention it is advantageous that the second magnetic coil has a smaller outer diameter than the first magnetic coil.

Moreover, it is advantageous that the ring magnet has an N/S polarity directing towards the substrate.

It is also advantageous that a shielding means is provided between the two magnetic coils.

In a further embodiment of the device according to the invention it is furthermore possible that the shielding means is provided between one of the yoke plates and the target or between the yoke plates and the substrate.

Moreover, it is advantageous that the shielding means is provided between one of the yoke plates and/or the insulator and the target.

An essential, advantageous embodiment is achieved in that the two yoke plates are spaced from each other with respect to the center axis and arranged in one plane in a target space and/or outside the target space.

Moreover, it is advantageous that the distance between the two yoke plates corresponds approximately to the height and/or width of the ring magnet.

Furthermore, it is advantageous that the two yoke plates are annular plates and that their outer diameters have different sizes and/or that they are arranged in the form of a step.

In a further development of the device according to the invention it is furthermore possible that the yoke plate having a smaller outer diameter is connected with the cooling finger and/or indirectly or directly with a hollow screw, and the yoke plate having a larger outer diameter is connected indirectly or directly with the pole shoe.

In a further embodiment of the invention it is advantageous that a means generating a varying magnetic field is provided in the area of a pole shoe.

In a preferred embodiment of the solution according to the invention it is eventually possible that the current fed to the coils can be changed depending on time.

It is of particular importance for the present invention that the current fed to the coils or the current supplied to the coils can be controlled via a control curve or a preset program and that for this purpose current conductors are in an operating connection with a computer via a current divider.

In connection with the development and arrangement according to the invention, it is advantageous that the first coil is provided in the area of the outer circumference of the yoke plate having a smaller diameter and the second coil is provided in the area of the inner circumference of the second yoke plate.

Moreover, it is advantageous that the two annular coils are also arranged in a stepped manner.

To this end it is advantageous that the shielding means arranged in the target space and/or outside the target space in the area of the substrate is arranged between the two coils in the same plane as the coils.

A further advantageous embodiment of the invention comprises at least one rotatable iron core.

Figure 2:
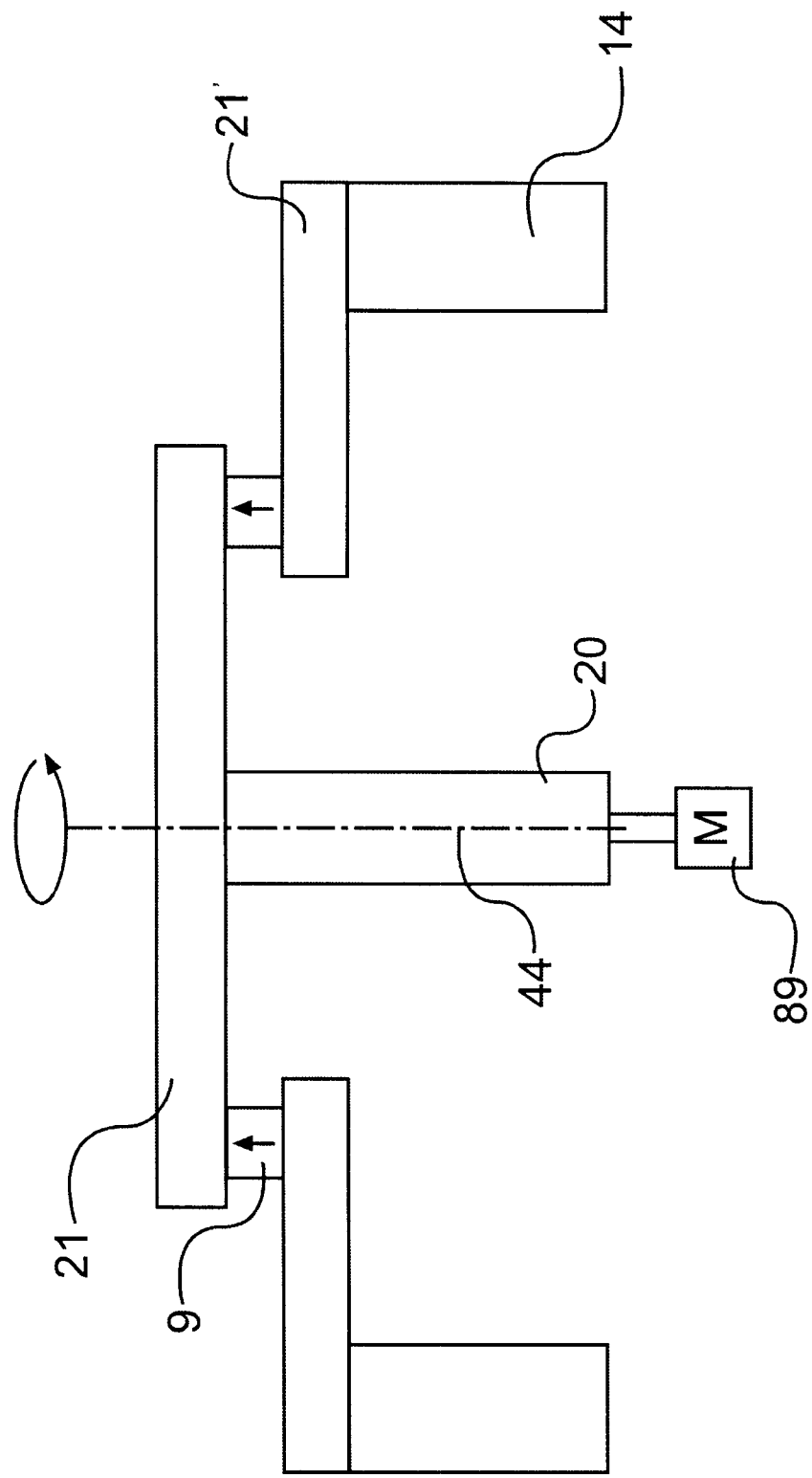
Figure 3:
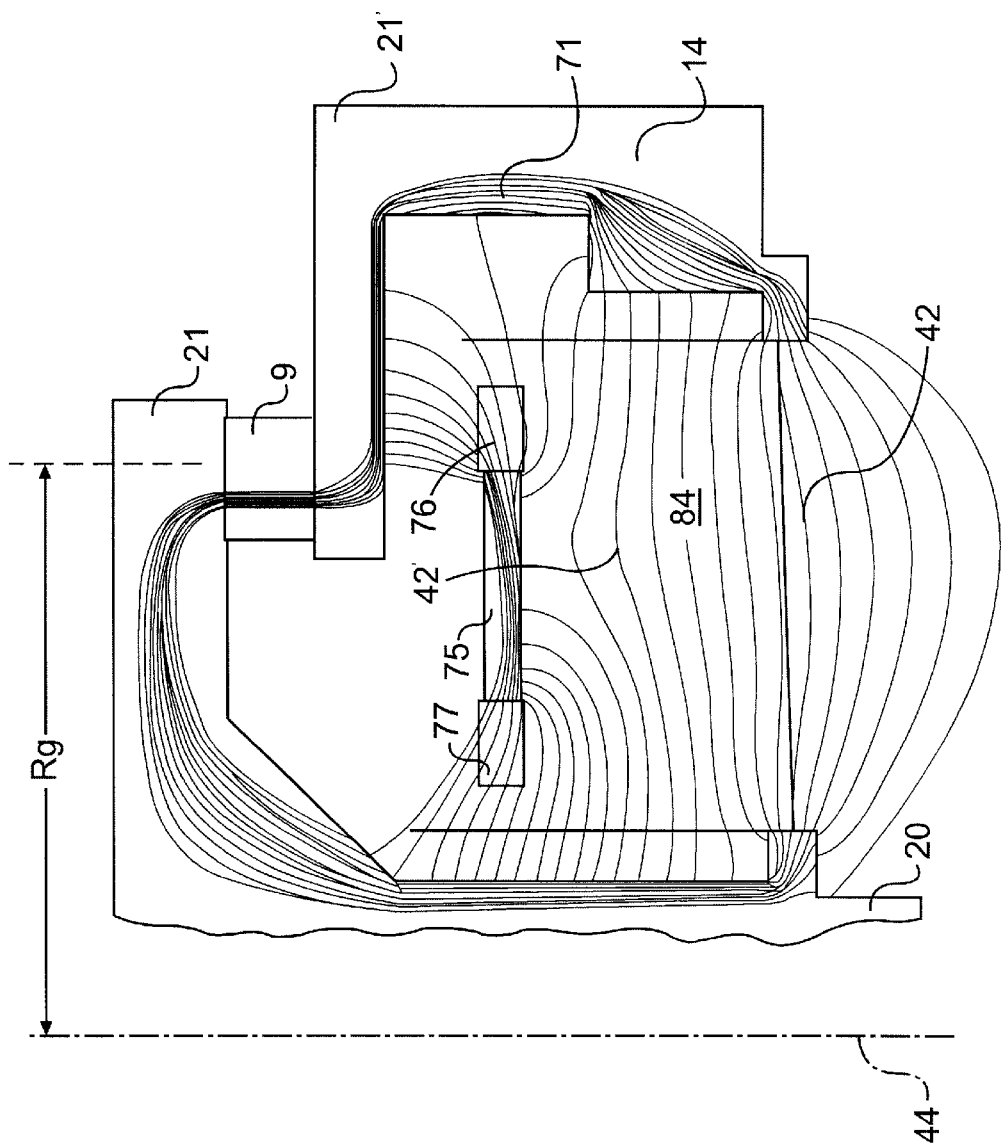
Figure 4:
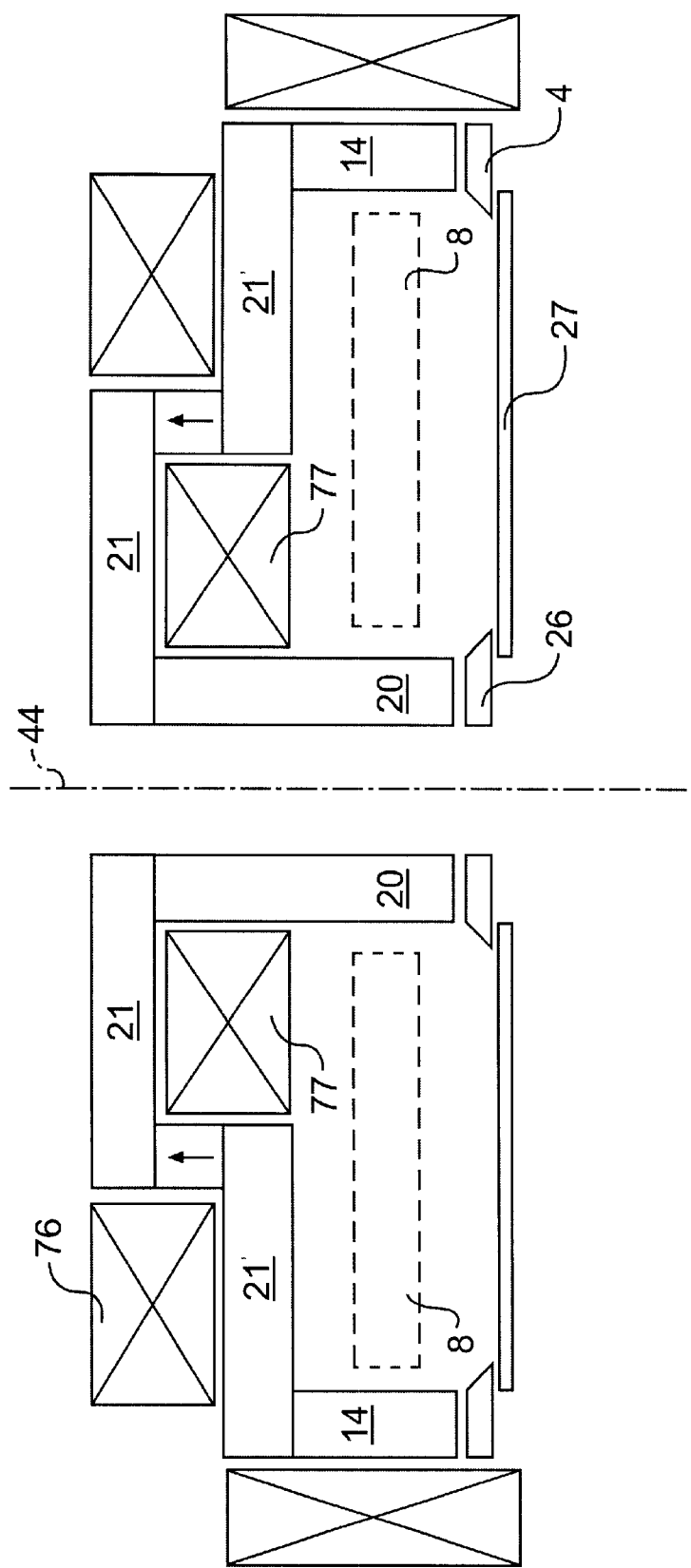
Figure 5:
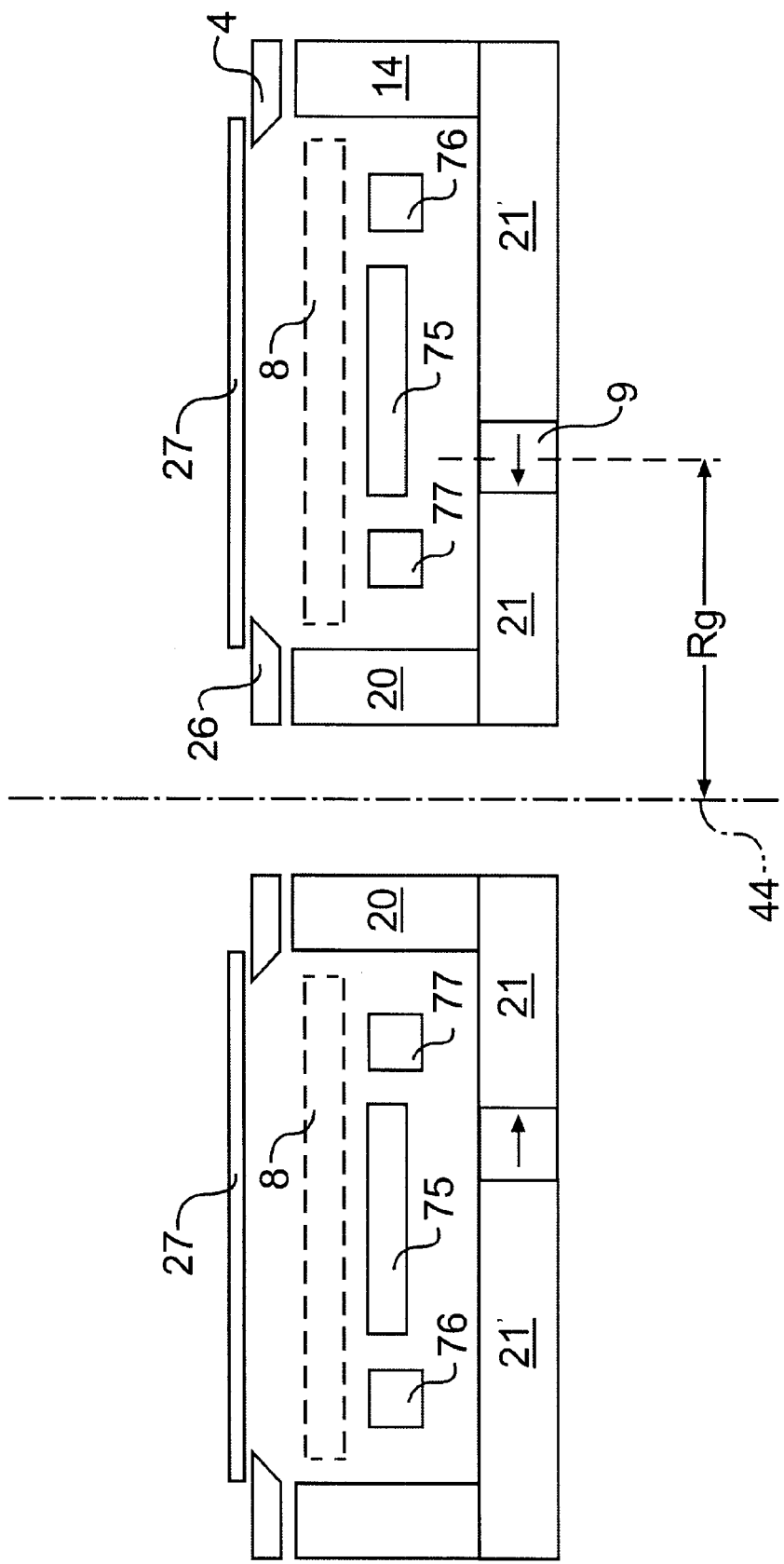
Figure 6:
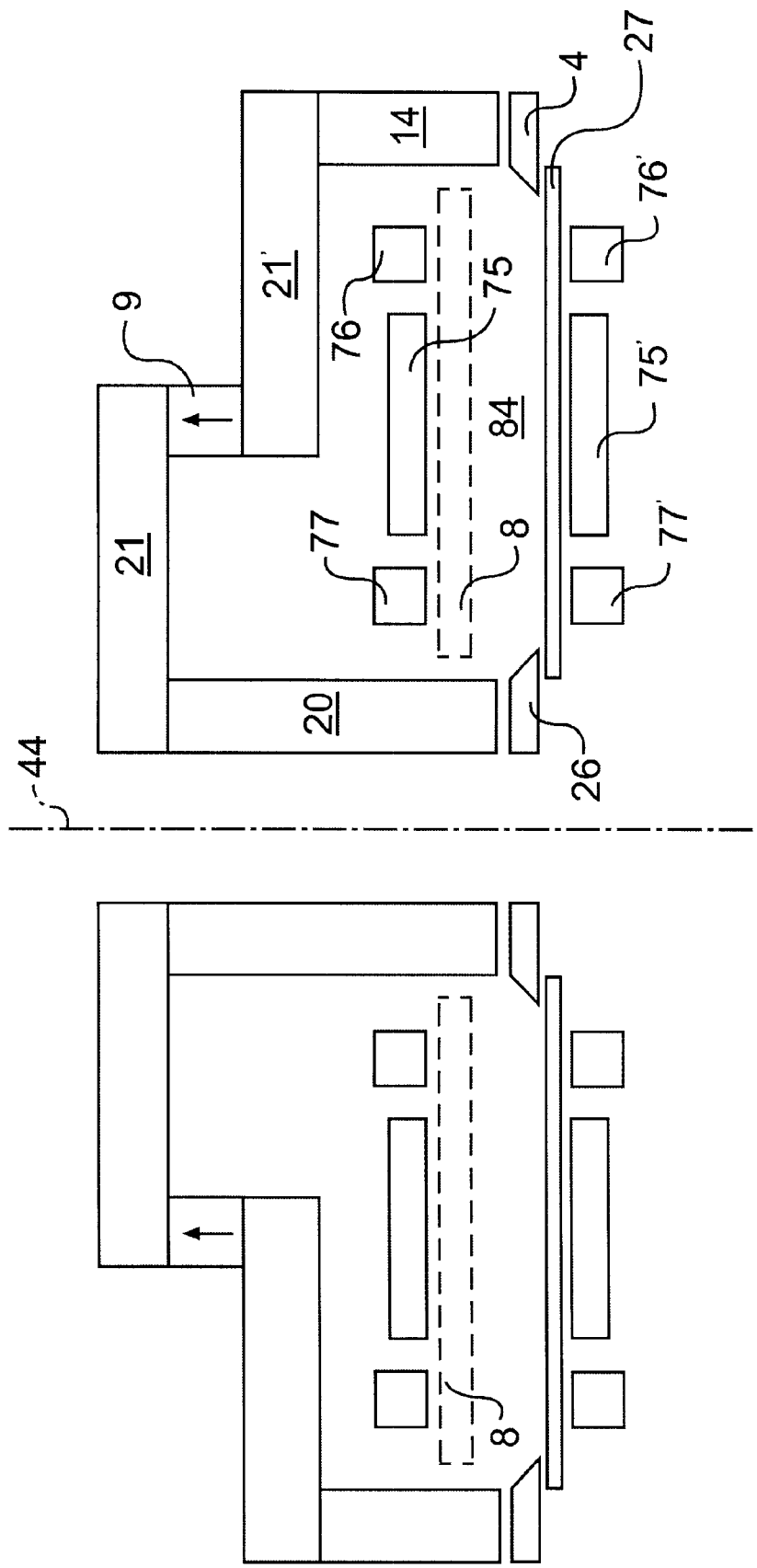
Figure 7:
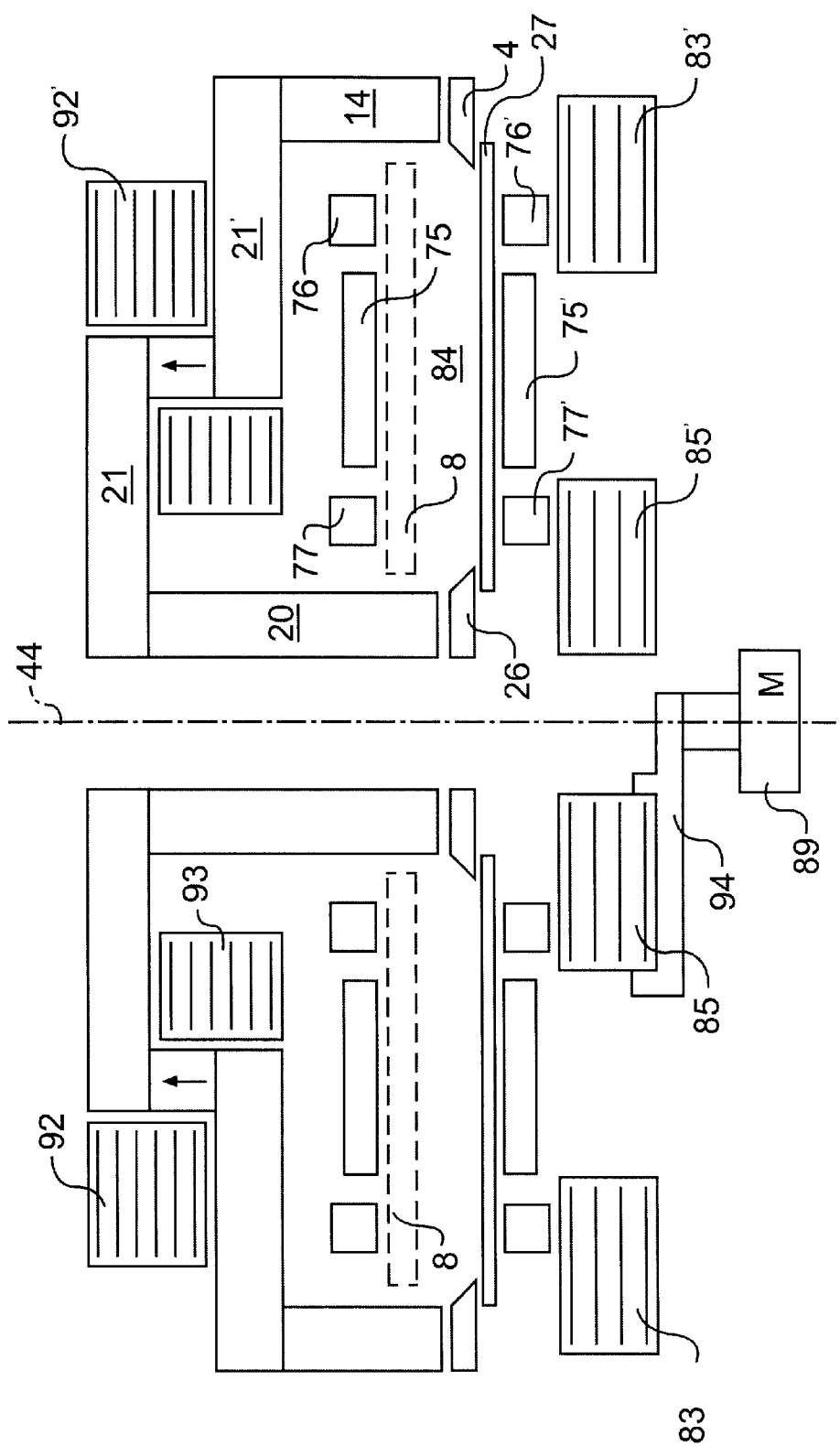

Further advantages and details of the invention are described in the claims and the description and shown in the Figures, in which FIG. 1 is a cross-sectional view of a target with a plurality of concentrically arranged coils and a ring of permanent magnets, FIG. 2 is a schematic view of a stepped yoke, FIG. 3 is a schematic view of the course of the magnetic field lines of the magnetic field according to the invention, FIGS. 4–6 are three schematic views of a stepped yoke with different coil or shielding means arrangements, and FIG. 7 is a schematic view of a stepped yoke with different iron core arrangements.

A cathode sputtering device for producing coatings on a substrate, e.g. a compact disk (CD) 27, is represented in FIG. 1. For performing the process, the sputtering cathode 2 can be installed in a chamber wall 1 of the cathode sputtering device. The cathode is composed of a disk-shaped ferromagnetic, first, lower yoke 21' (I) and a second or upper yoke 21 (II) spaced therefrom. The diameter of the first yoke 21' is larger than the diameter of the second yoke 21.

As is evident from FIGS. 1 and 2, the two yokes 21, 21' are arranged in the form of a step and axially symmetrically with respect to a longitudinal center axis 44 of the sputtering cathode 2, and they are sufficiently spaced from each other so that in this space an annularly arranged magnet 9 can also be arranged axially symmetrically with respect to the longitudinal center axis 44, the space having a corresponding height. This annularly arranged magnet 9 has an N/S polarity with respect to a target 8.

The inner yoke plate 21 having a smaller inner diameter is connected indirectly or directly with a cooling finger 74, and the yoke plate 21' having a larger outer diameter is connected indirectly or directly with a pole shoe 14.

In FIG. 3, for example, a means generating a varying magnetic field or one or several magnetic coils 76, 77 is/are provided in the area of the yoke plates 21, 21'.

The two magnetic coils 76, 77 shown in FIG. 1 are arranged in the same transverse plane under the lower horizontal plane of the yoke plate 21'.

A first magnetic coil 76 can be provided in the area of the outer circumference 55 of the target 8, and a second magnetic coil 77 can be provided in the area of the inner circumference 54 of the target 8 or in the area of the cooling finger or cooling head 74. The two magnetic coils 76, 77 are provided slightly above the upper limit 57 or the back side 40 of the target 8. In this respect, it is advantageous if the magnet 9, which is for example annularly arranged and provided in the area of the outer circumference of the first and/or second yoke 21, 21', is provided between the upper or second yoke plate 21 and the lower or first yoke plate 21' and the two magnetic coils 76, 77 and the annularly arranged magnet 9 are arranged concentrically with respect to the center axis 44 of the sputtering cathode 2.

The sputtering cathode 2 further comprises a cooling plate 7. An insulator 6 is clamped between the yoke 21' and the cooling plate 7 and secured by means of threaded bolts 91.

The target 8 to be sputtered is provided in front of the cooling plate 7. One or two annular grooves 86 for receiving an inner and an outer magnetic coil 76, 77 are provided on the back surface of the cooling plate 7, said magnetic coils 76, 77 being arranged concentrically with respect to the center axis 44 of the target 8.

The yoke or the insulator 6 and the cooling plate 7 are secured by means of bolts 91 and the cooling finger 74. The insulator 6 advantageously insulates the bolt 91 or a bolt 73 against the yoke.

A power supply for generating the magnetic field may be connected to the magnetic coils 76, 77 via electric conductors 78, 79.

The magnet 9 is coupled to the yoke 21 and/or 21' and the pole shoe 14 for conducting the magnetic flux and thus forms the complete magnetic confinement.

The lower end of the pole shoe 14 forms a flange 88 to which the exterior mask or an anode 4 is connected. The height of the pole shoe 14 and/or the height of the anode 4 is variable.

The substrate 27, which encloses the target space 84 together with the anode 4 and the target surface 41, is provided at the lower end of the anode 4.

A bore 67 extending through the entire device and serving for receiving a hollow screw 20 and the cooling finger 74 is arranged in the area of the center axis 44 of the sputtering cathode 2. The cooling finger 74 can be connected with a cooling line which is not shown in the Figure.

With a yoke plate, the second yoke 21 (II) adjoins the upper end of the hollow screw 20 in the axial direction without contacting the hollow screw 20.

The second yoke 21 (II) is connected to the upper end of the cooling head or cooling finger 74 by means of a flange 22, whereas the firs yoke 21' (I) is connected to the pole shoe 14 and can be secured by means of bolts 73, 73'.

A center mask or center anode 26 is detachably connected to the front surface or the lower end of a thread portion 90 of the cooling finger 74. The center anode 26 extends into the centric recess of the target 8, said centric recess being provided at the front surface of the target and its lower end forms, together with the exterior anode 4 or exterior mask, a ring-shaped area for masking the substrate 27.

The distance between the annularly arranged magnet 9 and the center axis 44 is variable depending on the embodiment. In any case, the annularly arranged magnet 9 is provided between the center axis 44 and the pole shoe 14. As is evident from FIG. 1, a shielding means 75 can be provided between the two coils 76, 77. Moreover, it is possible that the shielding means 75 is provided between one of the yoke plates 21, 21' and the target 8. The shielding means 75 is an iron core for the coils 76, 77 and increases their magnetic field, and, at the same time, it shields the target space 84 against the short circuit magnetic field lines of the magnet 9, so that a magnetic field variation can be generated with relatively low currents by means of the magnetic coils. For this purpose, the shielding means 75 can be provided between one of the yoke plates 21, 21' and/or the insulator 6 and the target 8. The magnet 9 serves for generating the magnetron magnetic field. According to FIG. 3, the field lines 71 of the cathode or the sputtering magnetron take, as field lines 42, a convex course above the target surface 41 and, as field lines 42', a flattened or approximately parallel course with respect to the back surface 40 of the target. This is advantageously also caused by the shielding means 75. Such an arrangement is particularly suitable in a non-ferromagnetic metal target, e.g. a gold or aluminum target.

The two magnetic coils 76, 77 are arranged slightly below the annularly arranged magnet 9. The annularly arranged magnet 9 can be formed of numerous single annularly arranged magnets.

Depending on the realization of the target 8, which can be realized, for example, as an aluminum target or a gold target, in addition to the first annularly arranged magnet 9, at least one further annularly arranged magnet, which is not shown in the Figure, can be provided in the vicinity of the magnet 9 in order to increase the absolute field strength.

As is evident from FIG. 1, the outer, annularly arranged magnet has a larger distance from the back surface 40 of the target than the two magnetic coils 76, 77.

By means of the magnetic coils 76, 77 shown in FIG. 3, the main magnetic field can be varied, and these coils 76, 77 can have any desired polarity. According to FIG. 3, the radius $R_9$ between the center axis 44 and the magnet 9 is variable or can be adjusted such that an optimum magnetic field 42 according to FIG. 3 can develop.

The current I fed to the coils 76, 77 can be varied depending on time. The current I fed to the coils 76, 77 or the current supply to the coils can be controlled via a control curve or a preset program in a computer 82, and, for this purpose, the current conductors 78, 79 are connected with a computer 82 via a current divider 80 (FIG. 1). Thus, the target surface 41 can be influenced purposefully throughout the entire sputtering process, and at the same time it is guaranteed that the coating produced on the substrate 27 has a constant thickness, wherein the thickness of the coating can deviate between ±2% to 3%. The required control curve can be determined empirically. Thus, for any corresponding target, e.g. a gold or aluminum target, a control curve being optimal for current supply can be determined.

It is particularly advantageous if the yoke is not integral, as already mentioned, but divided and consists of two individual parts, i.e. an upper and a lower yoke plate 21, 21', wherein these parts can consist of two axially symmetrical disks and be spaced from each other so that at least one magnet 9 can be provided between them.

FIGS. 4 to 6 show further embodiments of the cathode sputtering device for producing coatings on a substrate 27, in which embodiments the yoke plates 21, 21' or the pole shoe 14 and the coils 76, 77 can also be realized or arranged in a different way.

According to FIG. 4, the yoke plates 21, 21' are realized like steps, wherein the inner edge of the upper yoke plate of FIG. 4 is connected with the hollow screw 20 and the outer edge is connected with the inner edge of the lower, stepped first yoke plate 21' via the annularly arranged magnet 9. The outer edge of the first yoke plate 21' is connected with the pole shoe 14.

The first coil 76 having a larger diameter than the second coil 77 is located above the upper yoke plate 21 between the outer edge of the upper yoke plate 21 and the outer edge of the lower yoke plate, whereas the second coil 77 having a smaller diameter is located under the upper yoke plate 21 between the inner edge of the lower yoke plate 21' and the hollow screw 20. The remaining arrangement of this device corresponds to the arrangement of the device of FIG. 1.

In the embodiment of FIG. 5, the yoke plates 21, 21' are also divided and they are also realized as ring-shaped yoke plates 21, 21' having different diameters, wherein both yoke plates are arranged in a plane which is horizontal with respect to the base of the device and intersects the center axis 44 at right angles.

The ring magnet 9 is provided between the two yoke plates 21, 21'.

The two annularly arranged coils 76, 77 surround the shielding means 75 and, according to FIG. 5, are located in the target space 84.

The embodiment according to FIG. 6 differs from the embodiment according to FIG. 5 only in that a second shielding means 75' having two ring coils 76', 77' is located outside the target space 84 in the same arrangement according to FIG. 5.

The shielding plate 75 in the target space 84 or the shielding plate 75' outside the target space 84 having two coils 76, 77 or 76', 77' serve for purposefully and more optimally controlling the magnetic field. Thus, the lens shape of the magnetic flux lines (cf. magnetic field 42) is controlled. The lens-shaped realization of the magnetic field 42 according to FIG. 3 leads to the confinement of the electrons on the target 8, which electrons serve for ionizing the effective gas atoms, e.g. argon atoms, in the sputtering chamber; the electrons are held above the target 8 by means of the magnetic field, and they cannot flow to the anode in an optimum way and thus take part in the ionization process several times. Thus, it is additionally guaranteed that a constant coating thickness is achieved on the surface of the substrate 27.

Due to -his described arrangement and when taking into consideration the current-time-function ($f_{(I)}=I_{(t)}$), an optimum, constant coating thickness is achieved. As already mentioned, in this arrangement the current is varied in accordance with the target surface. By supplying different currents to the coils 76, 77, the plasma can be displaced radially above the target surface 41. This means that the plasma is displaced either to the left or right with respect to the surface of the target 8. Thus, the surface coating of the substrate 27 can be sputtered or grown well-directedly.

The stepped realization of the yoke plates 21, 21' allows a very simple and cost-efficient overall cathode design and also the use so a simple annularly arranged magnet, which can be realized, for example, as a square or rectangular magnet and not as a ring magnet and can easily be provided between the yoke plates 21 and 21'. Ring magnets are more complicated and thus more expensive than square or rectangular magnets.

According to FIG. 4, the coils 76, 77 are arranged at a greater distance from the target 8 than the coils of the embodiments according to FIGS. 5 and 6. Thus, the coils of FIG. 1 must be larger and supplied with more current than the coils 76, 77 of the embodiments according to FIGS. 5 and 6. According to FIG. 1, the plasma can be displaced as much as in the other embodiments, wherein the energy demand of FIG. 1 is slightly higher.

The individual coils can be controlled to different extents and, according to the embodiment, can be coupled or not. For example, the coils 76, 77 can be connected in series.

It is advantageous that by the use of the magnetic coils, which were arranged, as already described, under the target or at any other place, the magnetic field in the target space can be controlled and varied purposefully, so that the plasma can be displaced radially from inside to outside. It is therefore possible to displace the erosion groove radially over the target; thus, it is possible to produce on the one hand a very wide erosion groove by continuously varying the magnetic field and, on the other hand, two erosion grooves next to each other by stepwise switching the magnetic field back and forth.

A constant coating thickness can be achieved by adding to the stationary magnetic field a magnetic field changing with respect to time (or by overlapping these two magnetic fields). This variable magnetic field serves for optimizing the coating thickness during a coating cycle. For this purpose, a current-time-function, which is to be defined empirically, is made, as is described in more detail in DEB-196 54 000, for example.

The coils 76, 77 of FIGS. 5 and 6 provided in the target space 84 mainly serve for controlling the magnetic field in the target space. For controlling the magnetic field outside the target space 84, according to FIG. 6 the additional coils 76', 77' and the shielding plate 75' are provided.

In the embodiments also the yoke 21, 21' can be divided vertically with respect to the center axis 44. Thus, the magnet 9 can be arranged such that the magnetic flux can be distributed well among the hollow screw 20 and the pole shoe 14. Thus, a homogenous horizontal magnetic field can be obtained in the target space 84. As already mentioned, this magnetic field can be controlled purposefully by the coils 76, 77.

FIG. 7 shows an embodiment for the arrangement of four rotatable iron cores 83, 85, 92 and 93 around the axis 44; the rotary holding means 94 of the iron core 85 is shown schematically. The position of the iron cores after a rotation through 180° is shown in broken lines and indicated by 83', 85', 92' and 93'. Within the scope of the invention, any desired amount of such iron cores can be provided, one or two iron cores being preferred. By the shown rotation of the iron core around the axis 44, the magnetic field in the area of the surface of the target 8 is changed in accordance with time and optimized for achieving a very constant coating thickness and a high target yield.

As shown in the embodiment of FIG. 7, the yoke 21, 21' can also be divided and arranged axially symmetrically; moreover, for example in the area of the ring magnet 9, at least one further magnetic coil (not shown) generating a variable magnetic field can be provided.

What is claimed is:

1. A device for cathode sputtering for producing coatings on a substrate by means of a sputtering cathode arrangeable in a vacuum chamber and comprising:
   pole shoes;
   at least one magnet;
   first and second yoke plates which extend in the sputtering cathode from inside to outside in a radial direction, wherein the second yoke plate has an outer diameter greater than an outer diameter of the first yoke plate, wherein the first and the second yoke plates (21, 21') are displaced vertically relative to one another, and the at least one magnet is arranged between the first and second yoke plates.

2. The device according to claim 1, wherein the first and the second yoke plates are arranged in one plane.

3. The device according to claim 1, wherein the sputtering cathode is circular in cross section and the pole shoes and the first and second yoke plates are arranged coaxially with respect to the sputtering cathode.

4. The device according to claim 1, wherein the magnet is provided proximate an outer circumference of the first yoke plate between the first and the second yoke plate.

5. The device according to claim 1, wherein magnet has a north-south polarity directed towards the substrate.

6. The device according to claim 1, wherein the distance between the two yoke plates approximately corresponds to the height and/or width of the magnet.

7. The device according to claim 1, wherein the two yoke plates are annular plates having different outer diameters and/or being arranged in the form of a step.

8. The device according to claim 1, wherein the yoke plate having a smaller outer diameter is connected with a cooling finger in a central region of the sputtering cathode and/or indirectly or directly with a hollow screw, and that the yoke plate having a larger center diameter is indirectly or directly connected with the pole shoe.

9. The device according to claim 1, wherein a means generating a variable magnetic field is provided proximate said pole shoe.

10. The device according to claim 1, wherein a time-variable current is fed to the coils.

11. The device according to claim 1, further comprising:
    current conductors;
    a computer programmed with one of a control curve and a preset program; and
    a current divider,
    wherein a current fed to magnetic coils is controlled by the computer.

12. The device according to claim 2, wherein the two yoke plates are spaced from each other with respect to a center axis of the sputtering cathode and are arranged in a plane outside the target space.

13. A device for cathode sputtering for producing coatings on a substrate by means of a sputtering cathode arrangeable in a vacuum chamber and comprising:
    pole shoes;
    at least one magnet;
    a variable magnetic field source constructed and arranged to provide a variable magnetic field; and
    first and second yoke plates which extend in the sputtering cathode from inside to outside in a radial direction, wherein the second yoke plate has an outer diameter greater than an outer diameter of the first yoke plate, wherein the at least one magnet is arranged between the first and second yoke plates.

14. The device according to claim 13, wherein the yoke plates are provided proximate the magnet and the variable magnetic field source.

15. The device according to claim 13, wherein at least one first annularly arranged magnetic coil is provided between a target and the yoke plates.

16. The device according to claim 13, wherein a first magnetic coil is provided proximate an outer circumference of a target and a second magnetic coil is provided proximate an inner circumference of the target.

17. The device according to claim 16, wherein the two magnetic coils are provided above an upper limit or back surface of the target.

18. The device according to claim 16, wherein the two magnetic coils are arranged in the same transverse plane.

19. The device according to claim 18, wherein the two magnetic coils are arranged in the same transverse plane between one of the first and second yoke plates and a back surface of the target.

20. The device according to claim 16, wherein the two magnetic coils are arranged concentrically with respect to a center axis of the sputtering cathode.

21. The device according to claim 15, wherein the magnet has an outer diameter which is about as large as an outer diameter of the first coil.

22. The device according to claim 16, wherein ring chambers for receiving the magnetic coils are provided in one of the target and an insulator, wherein the insulator is provided between the target and at least one yoke plate.

23. The device according to claim 16, wherein the two magnetic coils have different diameters.

24. The device according to claim 23, wherein the second magnetic coil has a smaller outer diameter than the first ring coil.

25. The device according to claim 16, wherein an iron core is provided between the two coils.

26. The device according to claim 25, wherein the iron core is provided between the yoke plates and the target.

27. The device according to claim 25, wherein the iron core is provided between the insulator and the target.

28. The device according to claim 13, wherein a first coil is provided proximate an outer circumference of the first yoke plate and a second coil is provided proximate an inner circumference of the second yoke plate, wherein the first yoke plate has a smaller diameter than the second yoke plate.

29. The device according to claim 1, wherein with respect to a target, an iron core is arranged behind the substrate between two coils and in the same plane as the coils.

30. The device according to claim 16, wherein an iron core is arranged between two coils and in the same plane as the coils.

31. The device according to claim 13, wherein the variable magnetic field source comprises a electromagnet.

32. The device according to claim 13, wherein the variable magnetic field source comprises a rotatable iron core.

33. A device for cathode sputtering for producing coatings on a substrate by means of a sputtering cathode arrangeable in a vacuum chamber and comprising:

pole shoes;

at least one magnet;

first and second yoke plates which extend in the sputtering cathode from inside to outside in a radial direction, wherein the second yoke plate has an outer diameter greater than an outer diameter of the first yoke plate, and the at least one magnet is arranged between the first and second yoke plates, wherein at least one means generating a variable magnetic field or at least one rotatable iron core is provided, wherein a first coil is provided proximate an outer circumference of the first yoke plate and a second coil is provided proximate an inner circumference of the second yoke plate, wherein the first yoke plate has a smaller diameter than the second yoke plate, and wherein the two coils are ring shaped and are arranged in a stepped way.

* * * * *